(12) United States Patent
Xu (10) Patent No.: US 11,665,348 B2
(45) Date of Patent: *May 30, 2023

(54) BINARIZATION OF DQP USING SEPARATE ABSOLUTE VALUE AND SIGN (SAVS) IN CABAC

(71) Applicant: SONY GROUP CORPORATION, Tokyo (JP)

(72) Inventor: Jun Xu, San Jose, CA (US)

(73) Assignee: SONY GROUP CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/567,335

(22) Filed: Jan. 3, 2022

(65) Prior Publication Data

US 2022/0124331 A1    Apr. 21, 2022

Related U.S. Application Data

(63) Continuation of application No. 16/985,881, filed on Aug. 5, 2020, now Pat. No. 11,245,902, which is a
(Continued)

(51) Int. Cl.
*H04N 19/00* (2014.01)
*H04N 19/124* (2014.01)
(Continued)

(52) U.S. Cl.
CPC ........ *H04N 19/124* (2014.11); *H03M 7/3071* (2013.01); *H03M 7/4018* (2013.01);
(Continued)

(58) Field of Classification Search
CPC .... H03M 7/00; H03M 7/4006; H03M 7/6088; H03M 7/3071; H03M 7/4018;
(Continued)

(56) References Cited

U.S. PATENT DOCUMENTS 6,646,578 B1   11/2003  Au
7,013,050 B2   3/2006   Kajiwara
(Continued)

FOREIGN PATENT DOCUMENTS

BR    PI0918019 A2   11/2015
CN      1949873 A     4/2007
(Continued)

OTHER PUBLICATIONS

Non-Final Office Action for U.S. Appl. No. 14/795,102, dated Dec. 1, 2017, 12 pages.
(Continued)

*Primary Examiner* — Frank F Huang
(74) *Attorney, Agent, or Firm* — Chip Law Group (57) ABSTRACT

Video coding systems or apparatus utilizing context-based adaptive binary arithmetic coding (CABAC) during encoding and/or decoding, are configured according to the invention with an enhanced binarization of non-zero Delta-QP (dQP). During binarization the value of dQP and the sign are separately encoded using unary coding and then combined into a binary string which also contains the dQP non-zero flag. This invention capitalizes on the statistical symmetry of positive and negative values of dQP and results in saving bits and thus a higher coding efficiency.

14 Claims, 3 Drawing Sheets

Related U.S. Application Data continuation of application No. 15/909,030, filed on Mar. 1, 2018, now Pat. No. 10,791,328, which is a continuation of application No. 14/795,102, filed on Jul. 9, 2015, now abandoned, which is a continuation of application No. 13/345,320, filed on Jan. 6, 2012, now Pat. No. 9,112,526.

(60) Provisional application No. 61/503,430, filed on Jun. 30, 2011, provisional application No. 61/497,281, filed on Jun. 15, 2011.

(51) Int. Cl.

| | | |
|---|---|---|
| *H03M 7/30* | (2006.01) | |
| *H04N 19/176* | (2014.01) | |
| *H04N 19/70* | (2014.01) | |
| *H04N 19/61* | (2014.01) | |
| *H04N 19/91* | (2014.01) | |
| *H03M 7/40* | (2006.01) | |
| *H04N 19/184* | (2014.01) | |
| *H04N 19/50* | (2014.01) | |

(52) U.S. Cl.
CPC ........ *H03M 7/6088* (2013.01); *H04N 19/176* (2014.11); *H04N 19/184* (2014.11); *H04N 19/50* (2014.11); *H04N 19/61* (2014.11); *H04N 19/70* (2014.11); *H04N 19/91* (2014.11)

(58) Field of Classification Search
CPC ...... H04N 19/44; H04N 19/174; H04N 19/91; H04N 11/02; H04N 19/176; H04N 19/172; H04N 19/198; H04N 19/126; H04N 19/196; H04N 19/124; H04N 19/184; H04N 19/50; H04N 19/70; H04N 19/61
See application file for complete search history.

(56) References Cited

U.S. PATENT DOCUMENTS

| | | | | |
|---|---|---|---|---|
| 7,460,041 | B2* | 12/2008 | Yang | H03M 7/4006 |
| | | | | 341/106 |
| 8,135,062 | B1* | 3/2012 | Cote | H04N 19/176 |
| | | | | 375/240.03 |
| 9,112,526 | B2 | 8/2015 | Xu | |
| 9,560,348 | B2* | 1/2017 | Kondo | G06T 9/008 |
| 2005/0038837 | A1 | 2/2005 | Marpe et al. | |
| 2005/0253740 | A1 | 11/2005 | Marpe et al. | |
| 2006/0280371 | A1 | 12/2006 | Shimazaki et al. | |
| 2007/0080832 | A1 | 4/2007 | Yang et al. | |
| 2008/0063051 | A1* | 3/2008 | Kwon | H04N 19/124 |
| | | | | 375/240.03 |
| 2008/0240233 | A1 | 10/2008 | Au et al. | |
| 2009/0097548 | A1 | 4/2009 | Karczewicz et al. | |
| 2009/0225829 | A2* | 9/2009 | Kwon | H04N 19/147 |
| | | | | 375/240.03 |
| 2009/0296806 | A1 | 12/2009 | Hsu et al. | |
| 2011/0080947 | A1 | 4/2011 | Chen et al. | |
| 2011/0142419 | A1 | 6/2011 | Zou et al. | |
| 2011/0274162 | A1* | 11/2011 | Zhou | H04N 19/159 |
| | | | | 375/240.03 |
| 2012/0183049 | A1* | 7/2012 | Liu | H04N 19/46 |
| | | | | 375/240.03 |
| 2013/0034152 | A1 | 2/2013 | Song et al. | |
| 2016/0301931 | A1* | 10/2016 | Wen | H04N 19/192 |
| 2016/0368897 | A1* | 12/2016 | Acker | A61P 25/18 |
| 2017/0079530 | A1* | 3/2017 | DiMaio | A61B 5/0261 |
| 2017/0094274 | A1* | 3/2017 | Chien | H04N 19/159 |
| 2022/0272333 | A1* | 8/2022 | Jang | H04N 19/86 |
| 2022/0279210 | A1* | 9/2022 | Pu | H04N 19/463 |
| 2022/0286714 | A1* | 9/2022 | Lin | H04N 19/186 |
| 2022/0300483 | A1* | 9/2022 | Singh | G06F 16/2365 |
| 2022/0300484 | A1* | 9/2022 | Singh | G06F 16/27 |

FOREIGN PATENT DOCUMENTS

| | | |
|---|---|---|
| CN | 101164340 A | 4/2008 |
| CN | 101212676 | 7/2008 |
| CN | 101809871 A | 8/2010 |
| CN | 101820548 A | 9/2010 |
| CN | 102187672 A | 9/2011 |
| CN | 102201816 A | 9/2011 |
| EP | 2319244 A1 | 5/2011 |
| JP | 2007-020141 A | 1/2007 |
| JP | 4856954 B2 | 1/2012 |
| JP | 5373909 B2 | 12/2013 |
| KR | 10-2011-0050456 A | 5/2011 |
| WO | 2007/041911 A1 | 4/2007 |
| WO | 2010/021682 A1 | 2/2010 |

OTHER PUBLICATIONS

Advisory Action for U.S. Appl. No. 14/795,102, dated Jul. 6, 2017, 02 pages.
Final Office Action for U.S. Appl. No. 14/795,102, dated May 11, 2017, 16 pages.
Non-Final Office Action for U.S. Appl. No. 14/795,102, dated Oct. 4, 2016, 13 pages.
Notice of Allowance for U.S. Appl. No. 13/345,320, dated Apr. 10, 2015, 11 pages.
Advisory Action for U.S. Appl. No. 13/345,320, dated Feb. 5, 2015, 03 pages.
Final Office Action for U.S. Appl. No. 13/345,320, dated Nov. 17, 2014, 09 pages.
Non-Final Office Action for U.S. Appl. No. 13/345,320, dated Jul. 2, 2014, 11 pages.
Office Action for JP Patent Application No. 2012-137298, 10 pages.
Wiegand, et al., "WD3: Working Draft 3 of High-Efficiency Video Coding," Joint Collaborative Team on Video Coding (JCT-VC) of ITU-T SG16 WP3 and ISO/IEC JTC1/SC29/WG11, 5th Meeting: Geneva, Jun. 13, 2011, 03 pages.
Office Action for CN Patent Application No. 201210167530.6, dated Sep. 12, 2014, 07 pages of Office Action and 07 pages of English Translation.
Office Action for JP Patent Application No. 2014-091743, dated Aug. 8, 2017, 18 pages of Office Action and 3 pages of English Translation.
Budagavi, et al., "Delta QP Signaling At Sub-LCU level," Joint Collaborative Team on Video Coding of ITU-T SG16 NP3 and ISO/IEC JTC1/SC29/WG11, JCTVC-D038, 4th Meeting: Daegu, KR, Jan. 20-28, 2011, 5 pages.
Extended European Search Report of EP Patent Application No. 12168420.3, dated Aug. 3, 2012, 12 pages.
Sato, et al., "Description of Core Experiment 4: Quantization", Joint Collaborative Team on Video Coding of ITU-T SG16 WP3 and ISO/IEC JTC1/SC29/WG11, 5th Meeting: Geneva, CH,JCTVC-E704r1, Mar. 16-23, 2011, 9 pages.
Ghandi, et al., "A SNR Scalability Scheme Based on the H.264/AVC Video Coding Standard", Proc. of the International Conf. on Engineering Education, ICEE '04, Gainseville, USA, Oct. 2004, 06 pages.
Extended European Search Report of EP Patent Application No. 17168010.1, dated Jul. 26, 2017, 14 pages.
Extended European Search Report of EP Patent Application No. 17168015.0, dated Jul. 28, 2017, 13 pages.
David Salomon, "Data Compression: The Complete Reference", Chapter 2: Statistical Methods; Chapter 4: Image Compression; Chapter 6: Video Compression, XP-002746136, Jan. 23, 2007, 72 pages.
"Series H: Audiovisual and Multimedia Systems", ITU-T Recommendation H.264, International Telecommunication Union, Infrastructure of Audiovisual Services—Coding of Moving Video, May 2003, pp. 177-179.

(56) References Cited

OTHER PUBLICATIONS

Office Action for JP Patent Application No. 2016-026764, dated Aug. 22, 2017, 04 pages of Office Action and 03 pages of English Translation.
Office Action for JP Patent Application No. 2014-091742, dated Aug. 8, 2017, 14 pages of Office Action and 11 pages of English Translation.
Office Action for EP Patent Application No. 12168420.3, dated Mar. 14, 2017, 09 pages.
Office Action for JP Patent Application No. 2016-026764, dated May 9, 2017, 04 pages of Office Action and 04 pages of English Translation.
Office Action for CN Patent Application No. 201410767612.3, dated Mar. 22, 2017, 13 pages of Office Action and 08 pages of English Translation.
Office Action for JP Patent Application No. 2016-026764, dated Oct. 11, 2016, 04 pages of Office Action and 04 pages of English Translation.
Office Action for CN Patent Application No. 201410767615.7, dated May 9, 2018, 04 pages of Office Action and 11 pages of English Translation.
Office Action for CN Patent Application No. 201610519738.8, dated Jun. 25, 2018, 06 pages of Office Action and 11 pages of English Translation.
Extended European Search Report of EP Patent Application No. 18190747.8, dated Nov. 6, 2018, 14 pages.
Office Action for CN Patent Application No. 201610520974.1, dated Sep. 30, 2018, 09 pages of Office Action and 13 pages of English Translation.
Extended European Search Report of EP Patent Application No. 18190742.9, dated Nov. 28, 2018, 14 pages.
Non-Final Office Action for U.S. Appl. No. 15/909,030, dated Jun. 11, 2019, 12 pages.
Final Office Action for U.S. Appl. No. 15/909,030, dated Nov. 1, 2019, 11 pages.
Notice of Allowance for U.S. Appl. No. 15/909,030, dated Jun. 1, 2020, 05 pages.
Extended European Search Report of EP Patent Application No. 21172681.5, dated Jul. 5, 2021, 13 pages.
Notice of Allowance for U.S. Appl. No. 16/985,881, dated Sep. 27, 2021, 05 pages.
Notice of Allowance for U.S. Appl. No. 16/985,881, dated Oct. 14, 2021, 02 pages.
Notice of Allowance for U.S. Appl. No. 16/985,881, dated Nov. 3, 2021, 02 pages.

\* cited by examiner

BINARIZATION OF DQP USING SEPARATE ABSOLUTE VALUE AND SIGN (SAVS) IN CABAC

CROSS-REFERENCE TO RELATED APPLICATIONS

The present application is a continuation application of U.S. patent application Ser. No. 16/985,881, filed on Aug. 5, 2020, which is a continuation application of U.S. patent application Ser. No. 15/909,030, filed on Mar. 1, 2018, which is a continuation application of U.S. patent application Ser. No. 14/795,102, filed on Jul. 9, 2015, which is a continuation of U.S. Pat. No. 9,112,526, filed on Jan. 6, 2012, which claims the benefit of U.S. provisional patent application Ser. No. 61/503,430, filed on Jun. 30, 2011, and which claims the benefit of U.S. provisional patent application Ser. No. 61/497,281 filed on Jun. 15, 2011. Each of the above-referenced applications is hereby incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. .sctn.1.14.

BACKGROUND OF THE INVENTION

1. Field of the Invention

This invention pertains generally to video coding, and more particularly to binarization coding in Context-Based Adaptive Binary Arithmetic Coding (CABAC) within high efficiency video coding standards.

2. Description of Related Art

Storage and communication of videos in an efficient manner requires coding mechanisms for reducing spatial and temporal redundancies. Although a number of coding techniques exist, ongoing efforts are directed at increasing the efficiencies of these enCOder/DECoders (codecs) which respectively compress and decompress video data streams. The purpose of codecs is to reduce the size of digital video frames in order to speed up transmission and save storage space. The video coding advances made over the years have collectively contributed to the high levels of coding efficiency provided by state-of-the-art codecs. It is desired, however, that coding be performed at still higher efficiencies to further decrease video bit rates.

The latest of these developing coding standards is referred to as High Efficiency Video Coding (HEVC), from the Joint Collaborative Team on Video Coding (JCT-VC), which is a joint effort of the MPEG and VCEG standardization committees.

This developing standard includes both high efficiency and low complexity configurations includes a number of coding tools and includes either Context Adaptive Variable Length Coding (CAVLC) in a low complexity configuration, and Context Adaptive Binary Arithmetic Coding (CABAC) in a high efficiency configuration. The High Efficiency configuration uses and supports increased bit precision for internal operations and an adaptive loop filter.

HEVC employs Coding Unit (CU) structure, whose main difference from a macroblock structure (e.g., in previous MPEG-2 or AVC codecs) is that instead of a fixed size (e.g., 16.times.16), the size can vary up to 128.times.128. One Largest Coding Unit (LCU) represents both flat area and busy area, whereby providing a single QP value for one LCU is insufficient for obtaining high levels of subjective quality. Accordingly, HEVC separates the LCU into Coding-Units (CU), each of which are represented by their own QP which can differ from one CU to another. Delta-QP (dQP) can then be defined as the difference between QP of current CU and predicted QP based on the selected prediction algorithm within the CUs that are of sizes, such as 8.times.8, 16.times.16, 32.times.32 or 64.times.64. HEVC may perform QP prediction similarly as in the Advanced Video Coding (AVC) standard, although any desired technique may be utilized with the present invention without departing from the teachings of the invention.

Test model HM 3.0 of the HEVC coding standard uses Delta-QP (dQP) entropy coding in CABAC consisting of two steps: (1) flagging whether dQP is zero or not, and (2) if dQP is nonzero, the signed dQP is mapped to an unsigned codenumber and the unsigned codenumber is mapped to a binary string using unary codes. It will be noted that unary coding is an entropy encoding in which a natural number 'n' is represented by n ones followed by a zero or alternatively with n−1 ones followed by a zero. For example 5 can be represented as 111110 or 11110 in these unary representations.

Accordingly, new coding standards are being developed toward increasing coding efficiency and reducing coding complexity. The present invention provides improvements of the Delta-QP (dQP) coding within CABAC entropy coding.

BRIEF SUMMARY OF THE INVENTION

The present invention utilizes a different mode of binarization of the dQP in CABAC to fit the symmetric distribution of dQP. The approach in the current HM 3.0 test model assigns different lengths to nonzero dQP with the same absolute values. However, the statistics indicate that the distribution of dQP has a symmetric property, whereby nonzero dQPs having the same absolute values but different signs tend to have similar probabilities. It should be appreciated, however, that the invention can be applied to all video coding systems and standards which used signed syntax, such as Delta-QP, and within which the symmetry property is exhibited for positive and negative values.

Toward fitting the true distribution of dQP, this present invention performs binarization of dQP in CABAC, with modified steps of: (1) flagging to indicate whether dQP is zero or not, and (2) if dQP is nonzero, the absolute value of dQP is mapped to a binary string using unary codes. The sign of dQP is then encoded. Alternatively, the sign of dQP can be encoded first followed by the absolute value of dQP. Either of these alternatives is referred to herein as Separate Absolute Value and Sign (SAVS).

Further aspects and embodiments of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only.

DETAILED DESCRIPTION OF THE INVENTION

Context-Based Adaptive Binary Arithmetic Coding (CABAC) is one of the two entropy coding methods for use in the evolving HEVC standard, and was found in the H.264/AVC video coding standards. CABAC encoding generally consists of binarization, context modeling, and binary arithmetic coding. The Separate Absolute Value and Sign (SAVS) method of the invention provides a refinement of binarization for use in CABAC which is particularly well-suited for the statistical symmetry of probability for positive and negative codes of the same value.

In HEVC test Model (HM) 3.0, each CU may have different QPs. To signal the QP used to encode the CU, the difference, denoted by "dQP", between QP of the current CU and predicted QP is encoded in the syntax. The value of dQP is encoded by Context-based Adaptive Binary Arithmetic Coding (CABAC) under the HEVC High Efficiency (HE) configuration. The encoding process consists of two steps: (1) flagging the dQP is non-zero, and (2) mapping a signed dQP to an unsigned codenumber and the codenumber is mapped to a bin string using unary codes.

The approach in HM3.0 assigns different lengths to non-zero dQP with the same absolute values. For example, dQP=−1 is assigned 3 bits, while dQP=1 is assigned 2 bits. Statistics demonstrate that the distribution of dQP has a symmetric property, in which nonzero dQP having with the same absolute values but different signs tend to have similar probabilities.

The present invention encodes dQP in a way such that sign of dQP and absolute value of dQP are encoded separately. A flag is encoded indicating instances when dQP is non-zero, and then the absolute value of dQP and the sign of dQP are separately coded, or alternatively, the sign of dQP and then its absolute value are encoded. The separately coded sign and absolute value of dQP are combined into the final binary string. It will be noted that the order of coding the absolute value of dQP and the sign of dQP is interchangeable according to the invention.

Figure 1:
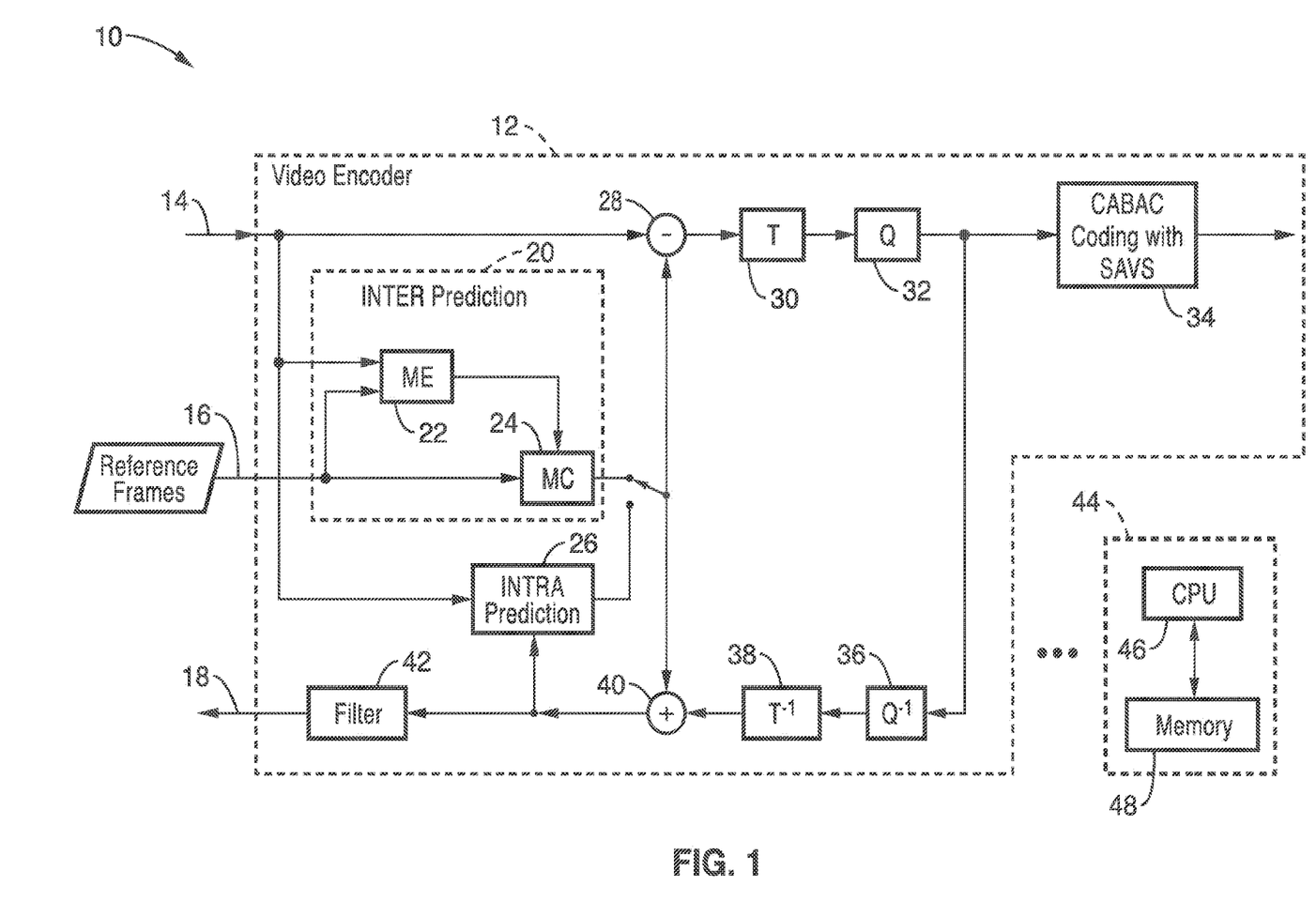
FIG. 1 is a block diagram of a CABAC based video encoder according to an embodiment of the present invention.
Figure 2:
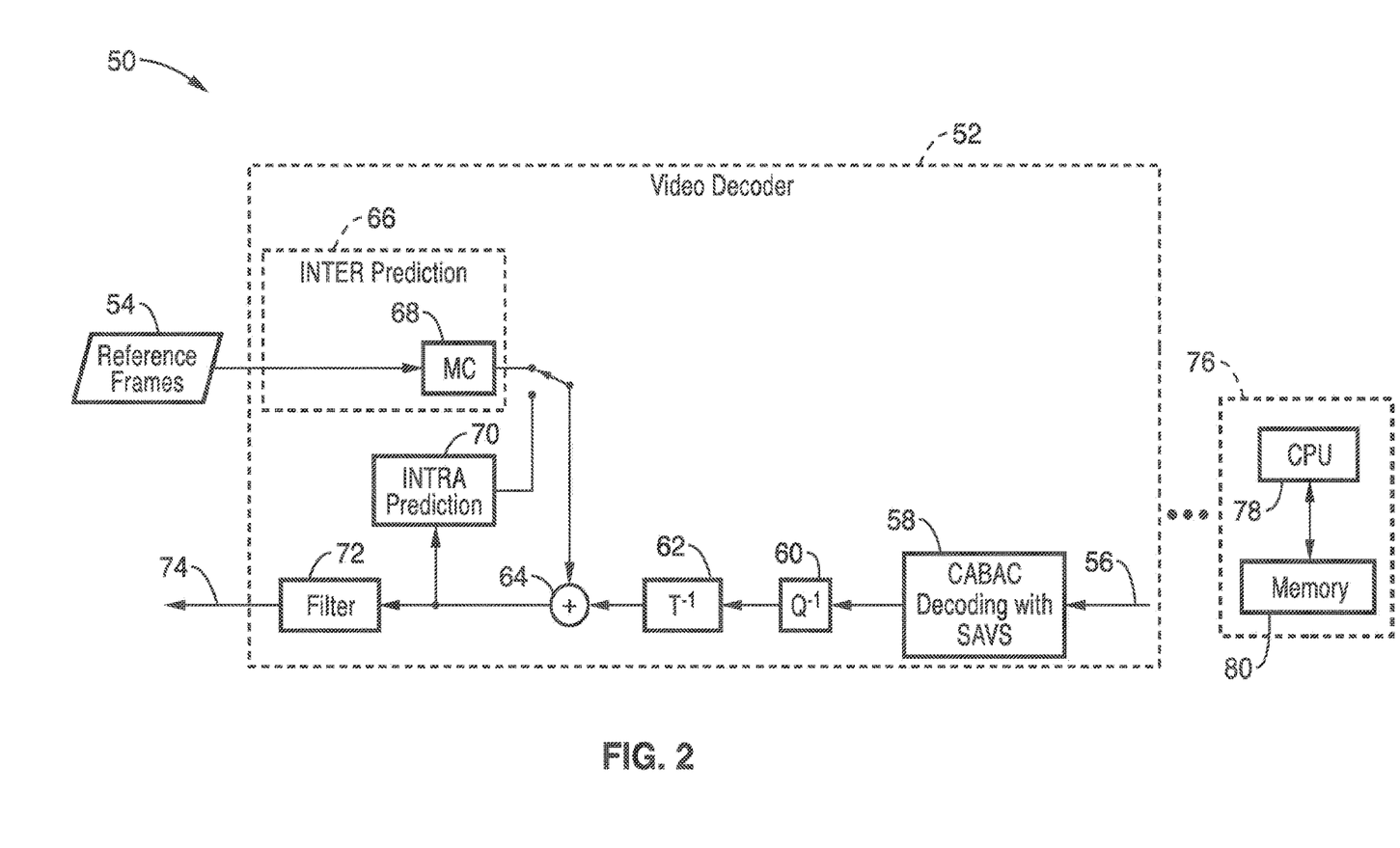
FIG. 2 is a block diagram of a CABAC based video encoder according to an embodiment of the present invention.

FIG. 1 through FIG. 2 illustrate example embodiments of a coding apparatus comprising an encoder 10 and decoder 50 configured according to the invention for coding using CABAC with the SAVS binarization mechanism.

In the embodiment of the invention shown in FIG. 1 through FIG. 2 the invention is implemented within the CABAC processing blocks of otherwise conventional video coding (encoding and/or decoding) system to minimize development work and toward maximizing compatibility.

The encoder 10 is shown in FIG. 1 having encoding elements 12 executed by one or more processors 44. In the example, video frame input 14 is shown along with reference frames 16 and frame output 18. Inter prediction 20 is depicted with motion estimation (ME) 22, and motion compensation (MC) 24. Intra prediction 26 is shown with switching between inter and intra prediction. A sum junction 28 is shown with output to a forward transform 30, quantization stage 32 and CABAC coding 34 with SAVS. An inverse quantization 36 and inverse transform 38 are shown coupled to a summing junction 40 and followed by a filter 42, such as a deblocking and/or loop filter.

It should be appreciated that the encoder is shown implemented with a processing means 44, such as comprising at least one processing device (e.g., CPU) 46 and at least one memory 48 for executing programming associated with the encoding. In addition, it will be appreciated that elements of the present invention can be implemented as programming stored on a media, which can be accessed for execution by a CPU for the encoder 10 and/or decoder 50.

In the decoder 50 of FIG. 2, decoding blocks 52 are shown along with a processing means 76, which is substantially a subset of the elements contained in the encoder, shown in FIG. 1, operating on reference frames 54 and outputting video 74. The decoder blocks receive an encoded video signal 56 which are processed through a CABAC with SAVS entropy decoder 58, inverse quantization 60, inverse transform 62 according to an embodiment of the invention. Summing 64 is shown between the inverse transform 62 output and the selection between inter prediction 66 shown with motion compensation 68 and intra prediction 70. Output from summing junction 64 is received by filter 72, which can be configured as a loop filter, a deblocking filter, or any combination thereof. It should be appreciated that the decoder can be implemented with a processing means 76 which comprises at least one processing device 78 and at least one memory 80 for executing programming associated with the encoding. In addition, it will be noted that elements of the present invention can be implemented as programming stored on a media, wherein said media can be accessed for execution by processing device (CPU) 78.

It should be appreciated that the programming is executable from the memory which is a tangible (physical) computer readable media that is non-transitory in that it does not merely constitute a transitory propagating signal, but is actually capable of retaining programming, such as within any desired form and number of static or dynamic memory devices. These memory devices need not be implemented to maintain data under all conditions (e.g., power fail) to be considered herein as non-transitory media.

It should be appreciated that the programming described herein is executable from a memory device (or devices) which comprise a tangible (physical) computer readable media that is non-transitory in that it does not merely constitute a transitory propagating signal, but is actually capable of retaining programming, such as within any desired form and number of static or dynamic memory devices. These memory devices need not be implemented to maintain data indefinitely, or under all conditions (e.g., power fail) to be considered herein as non-transitory media.

Figure 3:
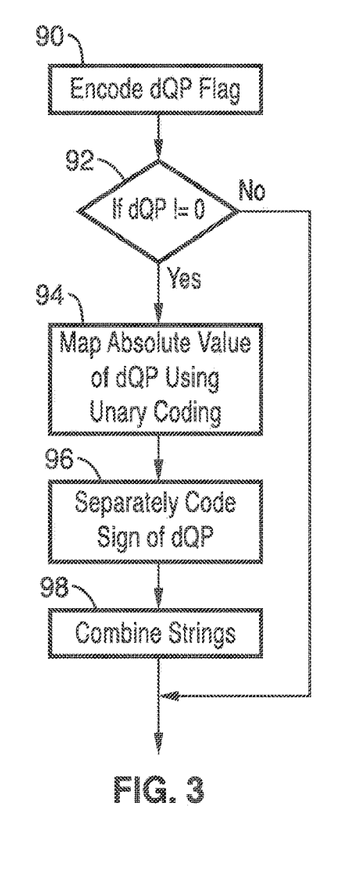
FIG. 3 is a flowchart of the new binarization method according to an embodiment of the present invention.

FIG. 3 is a flowchart of the CABAC SAVS method. The dQP flag is encoded 90, such as at the time the dQP value is determined. By way of example, a function is used to encode QP of the current CU, and inside the function dQP is first obtained as the difference of QP and the current CU and predicted CU, after which the dQP flag is encoded. If the dQP flag is found 92 to be non-zero, then the absolute value of dQP is mapped 94 (converted) using unary coding. The sign is also separately mapped 96 to a unary code, after which the separate codes are combined 98 into a string. It should be appreciated that the order of steps 94 and 96 can be reversed without impacting operation. If dQP is 0, then there is no value of dQP to encode, and for example the function for encoding QP just returns a dQP flag. It will be noted that a dQP flag is always encoded to indicate whether dQP is non-zero. In the non-zero examples of dQP described, it will be recognized that dQP always starts with a one "1" bit.

Figure 4A:
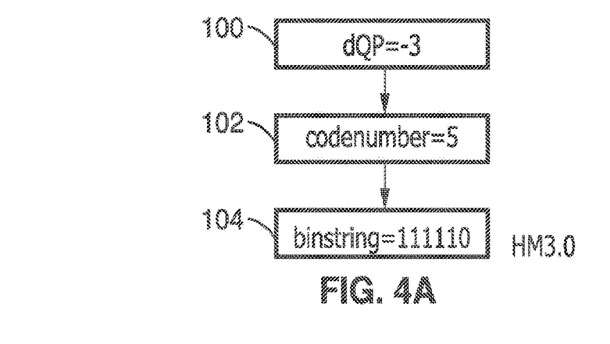
FIGS. 4A and 4B are process flows for binarization in an example of dQP-3, showing a comparison between HM3.0 in FIG. 4A and the method of the present invention in FIG. 4B.

FIG. 4A illustrates an example of binarization according to CABAC in the HM3.0 test specification. It is seen in this example of dQP at step 100 equal to −3 that the value (sign and absolute value) are unary coded at step 102 as a single entity with codenumber 5, resulting at step 104 in bitstring "111110" taking 5 binary places. The string in this example and in FIG. 4B, described below, does not illustrate the non-zero dQP bit preceding the coding of dQP.

Figure 4B:
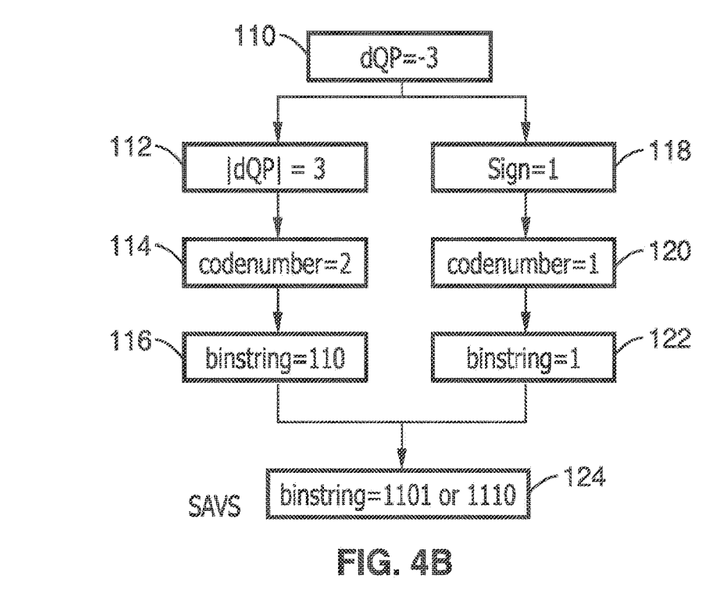

FIG. 4B illustrates an example of binarization according to CABAC SAVS. The same example coding 110 of −3 is shown with separate coding of sign and absolute value. Absolute value of 3 is taken at step 112, resulting at step 114 of codenumber 2, and at step 116 of bitstring 110 requiring 3 binary places. Similarly, the sign is coded at step 118, resulting at step 120 of codenumber 1, and at step 122 of bitstring 1. In step 124 the bitstrings are combined resulting to result in 1101, or 1110, depending on the order of combination. It should be appreciated that the number of binary digits required by this encoding is a total of 4 binary digits, as compared to the 6 digits used by the conventional coding.

As can be seen, therefore, the present invention includes the following inventive embodiments among others:

1. An apparatus for performing video coding, comprising: a computer configured for encoding and/or decoding of video; and programming configured for execution on said computer for: performing inter-prediction and/or intra-prediction for reducing temporal and/or spatial redundancies; performing a transform and quantization during encoding and/or inverse transform and inverse quantization during decoding; performing context-based adaptive binary arithmetic coding (CABAC) during encoding and/or decoding; and performing binarization of a non-zero Delta-QP (dQP) by (a) mapping absolute value of dQP using unary coding; (b) separately coding sign of dQP; and (c) combining binary strings for sign and absolute value.

2. The apparatus of embodiment 1, wherein said programming is alternatively configured for execution on said computer for coding of the sign for dQP prior to coding of the absolute value of dQP.

3. The apparatus of embodiment 1: wherein said video coding apparatus utilizes a Coding Unit (CU) structure in which block sizes are not fixed, and in which the Largest Coding Unit (LCU) is separated into multiple CU each having its own QP which can differ from one CU to another; and wherein Delta-QP (dQP) signals the difference between QP of the current CU and predicted QP is encoded in the syntax.

4. The apparatus of embodiment 1, wherein said video coding is performed according to the High Efficiency Video Coding (HEVC) standard.

5. The apparatus of embodiment 4, wherein said video coding is performed in a high efficiency coding mode within the High Efficiency Video Coding (HEVC) standard.

6. The apparatus of embodiment 1, wherein said apparatus comprises a coder/decoder (CODEC).

7. The apparatus of embodiment 1, wherein said programming is configured for execution on said computer for coding a flag bit indicating that dQP is non-zero, prior to the coding of the non-zero dQP and its sign.

8. The apparatus of embodiment 1, wherein said binarization benefits from the value of dQP having similar probability of being positive or negative for a given absolute value.

9. A method of performing video coding, comprising: performing inter-prediction and/or intra-prediction for reducing temporal and/or spatial redundancies; performing a transform and quantization during encoding and/or inverse transform and inverse quantization during decoding; performing context-based adaptive binary arithmetic coding (CABAC) during encoding and/or decoding; and performing binarization of a non-zero Delta-QP (dQP) by (a) mapping absolute value of dQP using unary coding; (b) separately coding sign of dQP; and (c) combining binary strings for sign and absolute value.

10. The method as recited in embodiment 1, wherein coding of the sign for dQP is alternatively performed prior to mapping of the absolute value of dQP.

11. The method as recited in embodiment 9: wherein said video coding method utilizes a Coding Unit (CU) structure in which block sizes are not fixed, and in which the Largest Coding Unit (LCU) is separated into CUs each having its own QP which can differ from one CU to another; and wherein Delta-QP (dQP) signals the difference between QP of the current CU and predicted QP is encoded in the syntax.

12. The method as recited in embodiment 9, wherein said video coding is performed according to the High Efficiency Video Coding (HEVC) standard.

13. The method as recited in embodiment 12, wherein said video coding is performed in a high efficiency coding mode within the High Efficiency Video Coding (HEVC) standard.

14. The method as recited in embodiment 9, wherein said apparatus comprises a coder/decoder (CODEC).

15. The method as recited in embodiment 9, wherein a flag bit is coded indicating that dQP is non-zero prior to the coding of the non-zero dQP and its sign.

16. The method as recited in embodiment 9, wherein said binarization benefits from the value of dQP having similar probability of being positive or negative for a given absolute value.

17. A non-transitory computer-readable media containing a computer program executable on a computer configured for performing video coding, comprising: performing inter-prediction and/or intra-prediction for reducing temporal and/or spatial redundancies; performing a transform and quantization during encoding and/or inverse transform and inverse quantization during decoding; performing context-based adaptive binary arithmetic coding (CABAC) during encoding and/or decoding; and performing binarization of a non-zero Delta-QP (dQP) by (a) mapping absolute value of dQP using unary coding; (b) separately coding sign of dQP; and (c) combining binary strings for sign and absolute value.

18. The computer-readable media of embodiment 17, wherein said programming is alternatively configured for execution on said computer for coding of the sign for dQP prior to mapping of the absolute value of dQP.

19. The computer-readable media of embodiment 17: wherein said video coding utilizes a Coding Unit (CU) structure in which block sizes are not fixed, and in which the Largest Coding Unit (LCU) is separated into CUs each having its own QP which can differ from one CU to another; and wherein Delta-QP (dQP) signals the difference between QP of the current CU and predicted QP is encoded in the syntax.

20. The computer-readable media as recited in embodiment 17, wherein said video coding is performed in a high efficiency coding mode according to the High Efficiency Video Coding (HEVC) standard.

Embodiments of the present invention may be described with reference to flowchart illustrations of methods and systems according to embodiments of the invention, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

From the discussion above it will be appreciated that the invention can be embodied in various ways, including the following:

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A video decoding apparatus, comprising:
   at least one processor configured to:
      obtain an absolute value of a differential quantization parameter and a sign value of the differential quantization parameter from a bit stream, wherein the differential quantization parameter is encoded such that the absolute value and the sign value are separated;
      decode the absolute value of the differential quantization parameter and the sign value of the differential quantization parameter in an order from the absolute value to the sign value, wherein the differential quantization parameter is a difference between a quantization parameter of a current coding unit and a predicted quantization parameter of the current coding unit;
      set the differential quantization parameter based on the decoded absolute value of the differential quantization parameter and the decoded sign value of the differential quantization parameter; and
      inversely quantize quantized data, wherein the quantized data is based on decode of the bit stream using the quantization parameter of the current coding unit.

2. The video decoding apparatus according to claim 1, wherein the quantization parameter of the current coding unit is obtained by addition of the set differential quantization parameter and the predicted quantization parameter.

3. The video decoding apparatus according to claim 1, wherein the at least one processor is further configured to execute a binary arithmetic decoding process on the absolute value of the differential quantization parameter and the sign value of the differential quantization parameter.

4. The video decoding apparatus according to claim 3, wherein
the differential quantization parameter is set for each coding unit of a plurality of coding units, and
each of the plurality of coding units is obtained by division of a largest coding unit.

5. The video decoding apparatus according to claim 1, wherein the at least one processor is further configured to decode each of the absolute value of the differential quantization parameter, a positive sign of the differential quantization parameter, and a negative sign of the differential quantization parameter in a case where the differential quantization parameter is non-zero.

6. The video decoding apparatus according to claim 5, wherein the at least one processor is further configured to determine whether the differential quantization parameter is non-zero.

7. The video decoding apparatus according to claim 6, wherein the at least one processor is further configured to determine whether the differential quantization parameter is non-zero based on a value that indicates that the differential quantization parameter is non-zero.

8. A video decoding method, comprising:
obtaining an absolute value of a differential quantization parameter and a sign value of the differential quantization parameter from a bit stream, wherein
the differential quantization parameter is encoded such that the absolute value and the sign value are separated;
decoding the absolute value of the differential quantization parameter and the sign value of the differential quantization parameter in an order from the absolute value to the sign value, wherein
the differential quantization parameter is a difference between a quantization parameter of a current coding unit and a predicted quantization parameter of the current coding unit;
setting the differential quantization parameter based on the decoded absolute value of the differential quantization parameter and the decoded sign value of the differential quantization parameter; and
inversely quantizing quantized data, wherein the quantized data is based on decode of the bit stream using the quantization parameter of the current coding unit.

9. The video decoding method according to claim 8, wherein the quantization parameter of the current coding unit is obtained by addition of the set differential quantization parameter and the predicted quantization parameter.

10. The video decoding method according to claim 8, further comprising executing a binary arithmetic decoding process on the absolute value of the differential quantization parameter and the sign value of the differential quantization parameter.

11. The video decoding method according to claim 10, wherein
the differential quantization parameter is set for each coding unit of a plurality of coding units, and
each of the plurality of coding units is obtained by division of a largest coding unit.

12. The video decoding method according to claim 8, further comprising decoding each of the absolute value of the differential quantization parameter, a positive sign of the differential quantization parameter, and a negative sign of the differential quantization parameter in a case where the differential quantization parameter is non-zero.

13. The video decoding method according to claim 12, further comprising determining whether the differential quantization parameter is non-zero.

14. The video decoding method according to claim 13, further comprising determining whether the differential quantization parameter is non-zero based on a value that indicates that the differential quantization parameter is non-zero.

* * * * *